United States Patent [19]

Southgate

[11] 3,842,189

[45] Oct. 15, 1974

[54] CONTACT ARRAY AND METHOD OF MAKING THE SAME

[75] Inventor: Peter David Southgate, Princeton, N.J.

[73] Assignee: RCA Corporation, New York, N.Y.

[22] Filed: Jan. 8, 1973

[21] Appl. No.: 321,801

[52] U.S. Cl. .................... 174/52 S, 29/626, 29/627, 136/213, 174/DIG. 3, 317/101 CC, 317/101 CM, 339/17 C

[51] Int. Cl. ............................................. H05k 5/00

[58] Field of Search ............ 174/DIG. 3, 52 S, 68.5; 317/101 CC, 101 CP, 101 CM, 234 G; 339/30, 17 CF; 337/378 C; 136/213

[56] References Cited

UNITED STATES PATENTS

| | | | |
|---|---|---|---|
| 3,111,352 | 11/1963 | Theodoseau | 339/30 |
| 3,176,381 | 4/1965 | Flarde | 174/68.5 X |
| 3,700,788 | 10/1972 | Spurck | 174/DIG. 3 |

*Primary Examiner*—Darrell L. Clay
*Attorney, Agent, or Firm*—Donald S. Cohen; Glenn H. Bruestle

[57] ABSTRACT

A contact array for electrically connecting two electrical devices, such as a radiation detector and a miniaturized electrical circuit, but with a minimum of heat conduction between the devices. Each of the contacts of the array includes at least one metal film attached at one end to one of the electrical devices and having a free end which extends away from the one device and engages the other device by elastic compression of the contact or by a bonding technique.

5 Claims, 7 Drawing Figures

CONTACT ARRAY AND METHOD OF MAKING THE SAME

BACKGROUND OF THE INVENTION

The invention herein disclosed was made in the course of or under a contract or subcontract thereunder with the Department of the Air Force.

The present invention relates to a contact array for electrically connecting two electrical devices and methods of making the array.

With the development of miniaturized electrical circuitry, such as integrated circuits which contain in a single body a plurality of electrical components connected in an operative circuit, it is now possible to combine in a single unit the miniaturized circuit device and some other electrical device which is operated by or which operates the miniaturized circuit. For example, a miniaturized circuit device can be combined with a radiation detector so that the output of the detector drives the circuit or with a radiation emitter so that the output of the circuit drives the emitter. To combine such two devices in a single package it is necessary to provide an electrical connection between the two devices. Because of the small size of these devices, making the electrical connection between the proper parts of the two devices can be difficult, particularly when they are combined in a small package. Also, where the devices have different operating temperatures, such as when one of the devices is a thermal detector, it is desirable that the electrical connection between the two devices provides a minimum of thermal connection.

SUMMARY OF THE INVENTION

An electrical device includes a substrate and a contact on a surface of the substrate. The contact includes a metal film having a portion adhered to the substrate and another portion projecting from and out of the plane of the surface of the substrate to engage another device. The electrical device is made by coating the metal film on the surface of the substrate with one portion of the metal film being adhered to the surface of the substrate. Another portion of the metal film is freed from the surface of the substrate and bent away from the surface.

DETAILED DESCRIPTION

Figure 1:
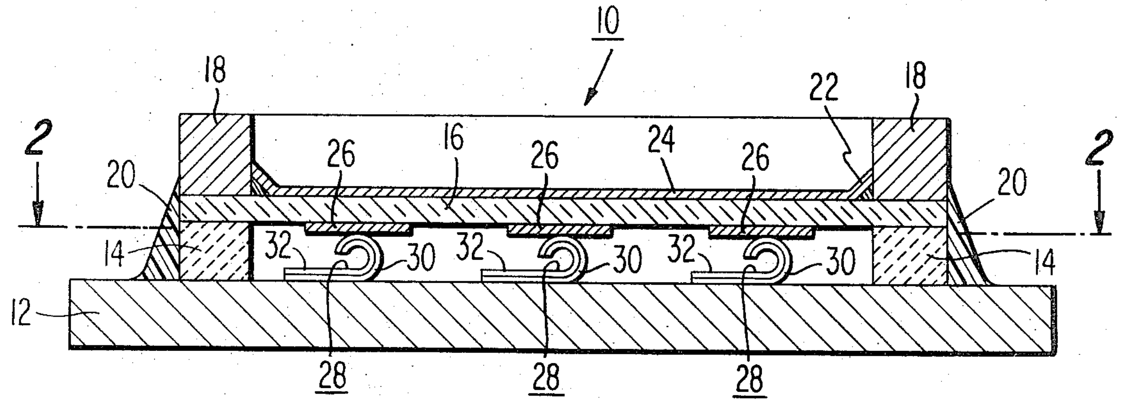
FIG. 1 is a sectional view of a thermal detector utilizing one form of the contact array of the present invention.
Figure 2:
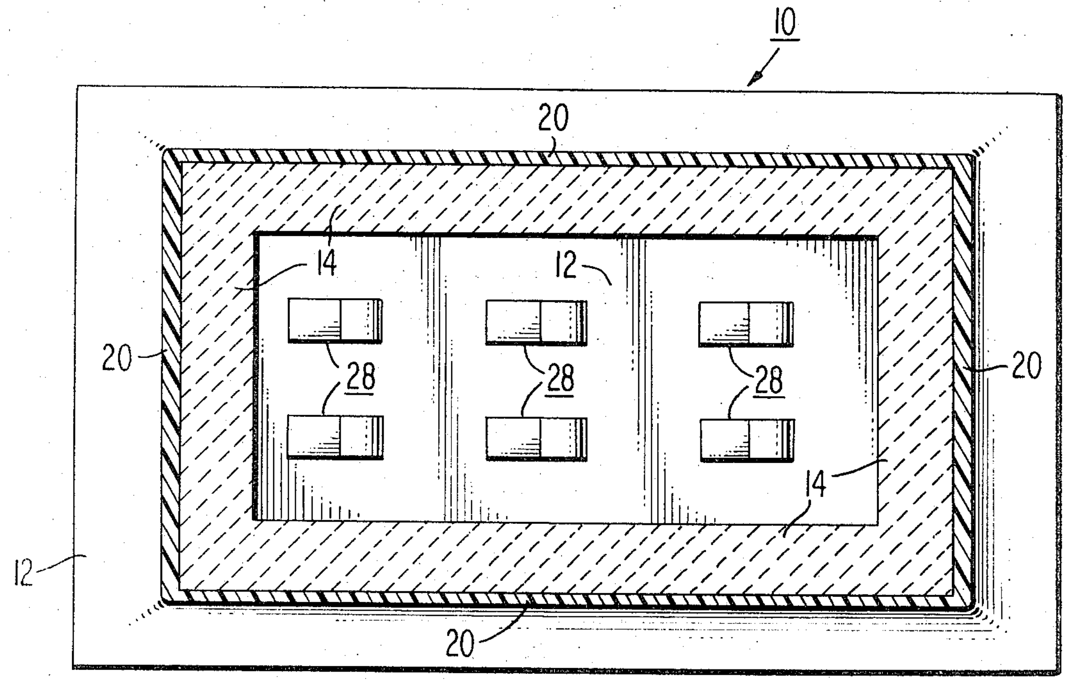
FIG. 2 is a sectional view along line 2—2 of FIG. 1.

Referring to FIGS. 1 and 2, a thermal detector utilizing one form of the contact array of the present invention is generally designated at 10. The detector 10 comprises a flat substrate 12 of a semiconductor material, such as single crystalline silicon. On a surface of the substrate 12 is a rectangular spacer frame 14 of an electrically insulating material. Seated on the spacer 14 and extending parallel to the substrate 12 is a sheet 16 of a pyroelectric material, such as triglycine sulfate, strontium barium niobate, lead zirconate titanate, or polyvinylidene fluoride. A rectangular metal frame 18 is seated on the pyroelectric sheet 16 over the spacer 14 to hold the pyroelectric sheet 16 on the spacer 14. The metal frame 18, pyroelectric sheet 16 and spacer 14 are secured to the substrate 12 by a suitable cement 20 extending around the outer edges thereof. The metal frame 18 is also secured to the pyroelectric sheet 16 by a suitable cement 22 extending around the inner edge of the metal frame. A metal film ground plane 24 is coated on the outer surface of the pyroelectric sheet 16.

On the inner surface of the pyroelectric sheet 16 is an array of a plurality of spaced metal film contact pads 26. The semiconductor substrate 12 has formed therein a plurality of electrical components, such as transistors, diodes etc. (not shown), which are arranged and connected together in a desired electrical circuit. On the inner surface of the substrate 12 is an array of a plurality of spaced, metal contacts 28. Each of the contacts 28 is attached at one end to the inner surface of the substrate 12 and is electrically connected to a portion of the circuit in the substrate 12. Th other end of each of the contacts 28 curls away from and out of the plane of the inner surface of the substrate 12 and resiliently engages a separate one of the contact pads 26 on the pyroelectric sheet 16. Each of the contacts 28 is formed of two superimposed metal films 30 and 32. It is known that thin films of certain metals have larger internal stresses than other metals when suitably deposited. Also, certain metals, such as chromium, can have large built-in tension stresses, and other metals, such as aluminum and rhodium, can have large built-in compression stresses. Thus, by making the outer film 32 of each of the contacts 28 of a metal having a large internal tension and/or the inner film 30 of a metal having a large built-in compression, the free end of each of the contacts 28 will automatically curl up to form a resilient spring for engaging the contact pad 26. Also, by making the contacts 28 of thin metal films the thermal conduction through the contacts is small so as to minimize the flow of heat through the contacts from the pyroelectric sheet 16 to the substrate 12. Thus, the contacts 28 provide for a good electrical connection between the pyroelectric sheet 16 and the substrate 12 with a minimum of heat conduction through the contacts. Also, as will be explained, the contacts 28 can be easily formed directly on the substrate 12 and can be very small in size. This provides for ease of assembling the detector 10 with the detector being very small in overall size.

Figure 3:
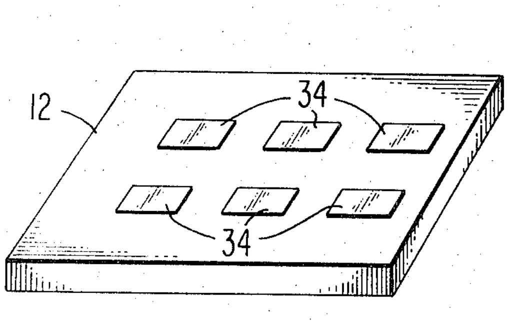
FIGS. 3, 4, and 5 are perspective views illustrating the steps of making the contact array shown in FIG. 1.
Figure 4:
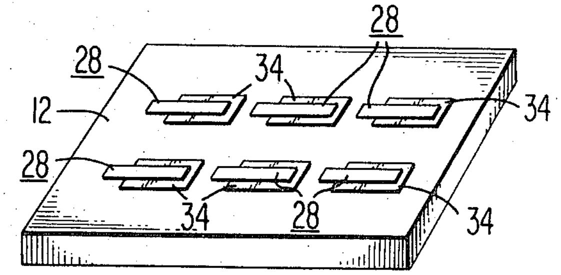
Figure 5:
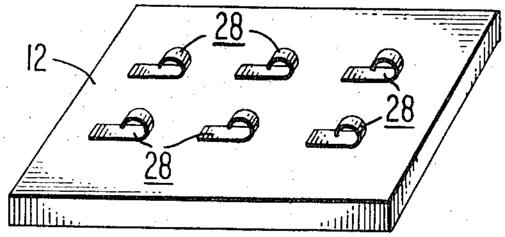

The contacts 28 are formed on the substrate 12 after the various components are formed in the substrate. To form the contacts 28 on the substrate 12, discrete areas of the surface of the substrate 12 are coated with a thin masking film 34 of a material which can be easily removed from the substrate 12, such as a resist material, a plastic, a wax, or the like (see FIG. 3). The masking films 34 are coated on the areas of the surface of the substrate 12 adjacent the areas to which the ends of the contacts 28 are to be attached. The masking films 34 may be coated on the surface of the substrate 12 by standard photolithographic techniques, silk screening, or painting, spraying or evaporation through a suitable mask. The superimposed metal films 30 and 32 of the contacts 28 are then coated partially over the masking films 34 and partially over the adjacent area of the surface of the substrate 12 as shown in FIG. 4. The metal films of the contacts 28 may be coated on the masking films 34 and the surface of the substrate 12 by the well-known technique of evaporation in a vacuum through a suitable mask. The masking films 34 are then removed with a suitable solvent. This frees the ends of the contacts 28 which curl up because of the built-in stresses in one or both of the metal films 30 and 32 as shown in FIG. 5. Thus, the contacts 28 have one end attached to the surface of the substrate 12 and the other end curled up to engage the contact pads 26 of the pyroelectric sheet 16 when the pyroelectric sheet is placed over the substrate 12.

Figure 6:
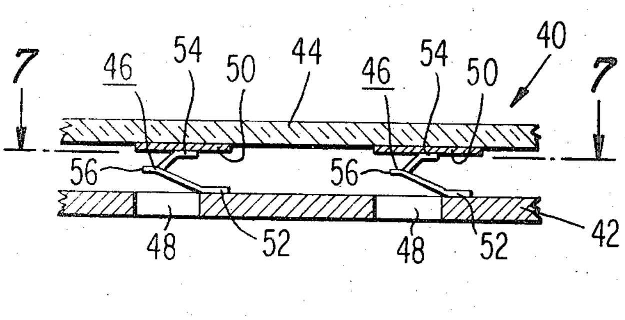
FIG. 6 is a sectional view of a portion of a thermal detector using another form of the contact array of the present invention.
Figure 7:
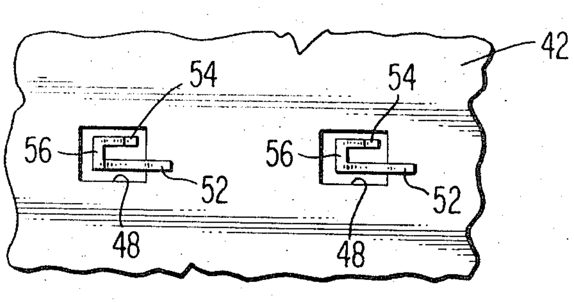
FIG. 7 is a sectional view taken along line 7—7 of FIG. 6.

Referring to FIGS. 6 and 7, a heat detector having another form of the array of contacts is generally designated as 40. The detector 40 comprises a flat substrate 42 of a semiconductor material, a sheet 44 of a pyroelectric material in closely spaced, parallel relation to the substrate 42, and a plurality of contacts 46 between the substrate 42 and the pyroelectric sheet 44. The substrate 42, like the substrate 12 of the detector 10 shown in FIG. 1, contains a plurality of electrical components, such as transistors, diodes and the like, connected in a desired electrical circuit. In addition, the substrate 42 has a plurality of spaced holes 48 therethrough. The pyroelectric sheet 44 like the pyroelectric sheet 16 of the detector 10 shown in FIG. 1, has a plurality of spaced, metal film contact pads 50 on its inner surface. The contact pads 50 are engaged by the contacts 46.

Each of the contacts 46 is a substantially J-shaped metal film having a long leg 52, a short leg 54 in spaced, parallel relation to the long leg 52, and a base portion 56 connecting one end of the short leg 54 to one end of the long leg 52. The other end of the long leg 52 is bonded to the surface of the substrate 42 adjacent an edge of a hole 48. The short leg 54, base portion 56 and a portion of the long leg 52 extend over the hole 48. As shown in FIG. 6, the long leg 52 is bent adjacent the edge of the hole 48 so that the portion of the long leg which is over the hole 48 extends away from the surface of the substrate 42. The base portion 56 is also bent so that the short leg 54 extends further away from the surface of the substrate 42 and the free end of the short leg 54 engages the contact pad 50 on the pyroelectric film 44.

The contacts 46 are formed on the substrate 42 after the various electrical components are formed in the substrate but before the holes 48 are formed in the substrate. The contacts 46 are formed by first coating the J-shaped metal films on the surface of the substrate 42. This can be achieved by the well-known technique of vacuum evaporation through a mask which is over the surface of the substrate 42. It can also be achieved by coating the entire surface of the substrate 42 with a metal film, coating the areas of the metal film which are to form the contacts with a resist material using standard photolithographic techniques, and then etching away the uncovered portion of the metal film.

The holes 48 are then formed through the substrate 42. This can be achieved by coating the outer surface of the substrate 42 except where the holes are to be formed with a resist material using standard photolithographic techniques. The uncovered portions of the substrate 42 are then etched away completely through the substrate using a suitable etchant for the particular material of the substrate. When the holes 48 are formed through the substrate 42, the short leg 54, base portion 56, and a portion of the long leg 52 of each of the contacts 46 is free from the substrate 42. The free portion of each of the contacts is then bent away from the substrate 42. This can be achieved by forcing a current of air or liquid through the holes 48 at a suitable rate. The substrate 42 with the contacts 46 thereon can then be assembled with the pyroelectric sheet 44 in the manner previously described with regard to the detector 10 shown in FIG. 1. Alternatively, a small quantity of an adhesive material, such as an electrically conductive cement or a low temperature solder, may be placed on the end of the short leg 54 of each contact 46. The pyroelectric sheet 44 is then placed so that the contact pads 50 engage the adhesive material to bond the short legs 54 to the contact pads 50. The pyroelectric sheet 44 is then slightly separated from the substrate 42 causing the contacts 46 to bend to the form shown in FIG. 6.

I claim:

1. An electrical device comprising
a substrate, and
a contact on a surface of said substrate, said contact including two superimposed metal films and having a first end portion extending along and attached to said surface of the substrate and a second end portion projecting from and out of the plane of said surface to engage another device, at least one of said metal films being of a metal having internal stresses which causes the second end portion to curl away from the surface of the substrate.

2. An electrical device in accordance with claim 1 in which the outer of the two metal films which is away from the surface of the substrate is of a metal which has internal tension stresses.

3. An electrical device in accordance with claim 1 in which the inner of the two metal films which is adjacent the surface of the substrate is of a metal which has internal compression stresses.

4. An electrical device in accordance with claim 1 including a plurality of the contacts in spaced relation on the surface of the substrate.

5. An electrical device in accordance with claim 4 including a body having a surface in opposed, spaced relation with said surface of the substrate and the second end portion of each of said contacts engages the surface of the body.

* * * * *